United States Patent [19]

Ozaki

[11] Patent Number: 4,876,704

[45] Date of Patent: Oct. 24, 1989

[54] LOGIC INTEGRATED CIRCUIT FOR SCAN PATH SYSTEM

[75] Inventor: Hideharu Ozaki, Tokyo, Japan

[73] Assignee: NEC Corporation, Tokyo, Japan

[21] Appl. No.: 136,572

[22] Filed: Dec. 22, 1987

[30] Foreign Application Priority Data

Dec. 22, 1986 [JP] Japan ................................ 61-307009

[51] Int. Cl.⁴ ..................... G01R 31/28; G11C 19/00
[52] U.S. Cl. ......................................... 377/70; 377/47; 377/54; 377/75; 377/77; 371/25; 324/73 R
[58] Field of Search ...................... 377/70, 29, 44, 47, 377/54, 77, 78, 75, 80, 81, 111, 114–116, 28; 371/15, 25, 27; 324/73 R, 73 AT

[56] References Cited

U.S. PATENT DOCUMENTS

| | | | |
|---|---|---|---|
| 3,777,278 | 12/1973 | Majeau et al. | 377/75 |
| 3,806,891 | 4/1974 | Eichelberger et al. | 377/81 |
| 3,949,199 | 4/1976 | Odom | 377/44 |
| 4,377,757 | 3/1983 | Konemann et al. | 377/77 |
| 4,536,881 | 8/1985 | Kasuya | 377/70 |
| 4,581,740 | 4/1986 | Kinoshita | 377/54 |
| 4,627,085 | 12/1986 | Yuen | 377/81 |
| 4,682,329 | 7/1987 | Kluth et al. | 371/25 |
| 4,698,830 | 10/1987 | Barzilai et al. | 377/81 |
| 4,733,405 | 3/1988 | Shimizume et al. | 377/70 |
| 4,740,970 | 4/1988 | Burrows et al. | 371/25 |
| 4,754,215 | 6/1988 | Kawai | 324/73 AT |
| 4,799,004 | 1/1989 | Mori | 324/73 R |

OTHER PUBLICATIONS

Williams et al., "Design for Testability-A Survey", IEEE Transactions on Computers, vol. C.31, No. 1, Jan. 1982, pp. 2–15.

Primary Examiner—John S. Heyman
Assistant Examiner—Tai V. Duong
Attorney, Agent, or Firm—Sughrue, Mion, Zinn, MacPeak & Seas

[57] ABSTRACT

A logic integrated circuit of the scan path system comprises a combination circuit and a shift register associated to the combination circuit and including a plurality of cascaded flipflops. The shift register has a scan input, a clock input, a scan control input, and a scan output. A scan input terminal is connected to the scan input of the shift register, and a clock terminal is connected to the clock input of the shift register. A scan output terminal is connected to the scan output of the shift register. Further, there is provided a counter having an input connected to the clock terminal and an output connected to the scan control input of the shift register. This counter has a frequency division ratio equivalent to the stage number of the flipflops in the shift register, so that the shift register is switched between a shift register mode and a normal mode by the frequency division signal from the counter.

2 Claims, 5 Drawing Sheets

LOGIC INTEGRATED CIRCUIT FOR SCAN PATH SYSTEM

BACKGROUND OF THE INVENTION

1. Field of the Invention

The present invention relates to a so-called scan path testing, and more specifically, to a logic integrated circuit for the scan path system.

2. Description of related art

As one means for ensuring testability of digital networks, the scan path system has been proposed, as reviewed in IEEE TRANSACTIONS ON COMPUTERS, Vol C-31, No. 1, January 1982, pp 7–11. In the conventional logic integrated for this scan path system, there have been provided terminals dedicated for only the scan path test, which include a clock signal terminal for a shift register, an input signal terminal for the shift register, an output signal terminal for the shift register, and a terminal for a scan control signal for selection between a normal mode and a shift register mode in the scan path testing. On the other hand, a recent advancement has increased the length of data processed in an integrated circuit. This inclination will require decrease of the number of terminals other than data terminals, because the integrated circuit can have only a limited number of terminals.

SUMMARY OF THE INVENTION

Accordingly, it is an object of the present invention to provide a logic integrated circuit for the scan path system, which has terminals of the number smaller than that required in the conventional one.

Another object of the present invention is to provide a logic integrated circuit for the scan path system without requiring a terminal for scan control signal.

The above and other objects of the present invention are achieved in accordance with the present invention by a logic integrated circuit for the scan path system which comprises a plurality of cascaded flipflops, a combination circuit associated to the flipflop, and a counter having a frequency division ratio equivalent to the number of the flipflops, the counter being connected to receive a clock signal supplied to the cascaded flipflops and to generate a frequency divided signal as a scan control signal for selection between a shift register mode and a normal mode.

The above and other objects, features and advantages of the present invention will be apparent from the following description of the preferred embodiments of the invention with reference to the accompanying drawings.

DESCRIPTION OF THE PREFERRED EMBODIMENTS

Figure 1:
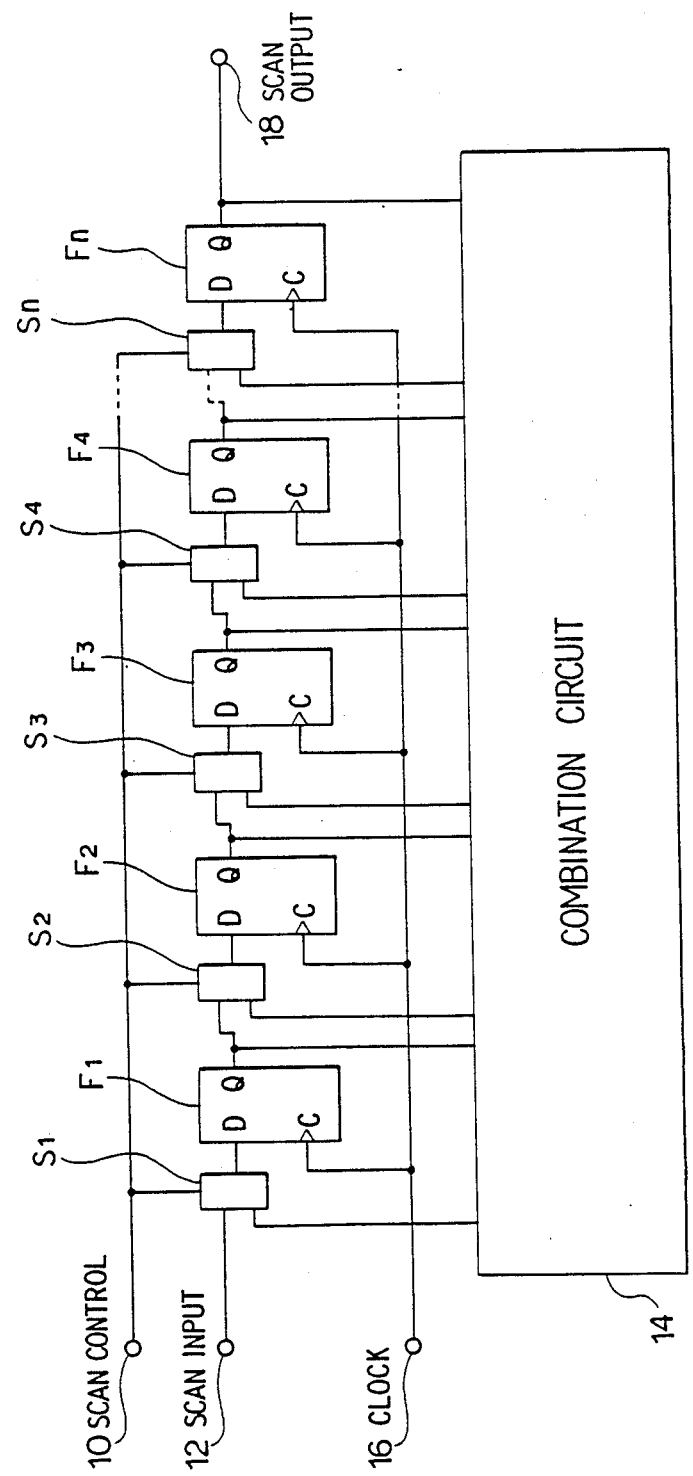
FIG. 1 is a block diagram of a conventional logic integrated circuit for the scan path system.

Referring to FIG. 1, there is shown a block diagram of one conventional logic integrated circuit for the scan path system.

The shown circuit includes a number of flipflops $F_1$ to $F_n$ connected in a cascade fashion to construct a shift register. Each of the flipflop includes a data input D, a clock input C and a data output Q. Selectors $S_1$ to $S_n$ are connected at their outputs to the data inputs D of the first flipflops $F_1$ to $F_n$, respectively, as shown in FIG. 1. Each of the selectors $S_1$ to $S_n$ is connected at a control input thereof to a scan control signal terminal 10. A first input of the first selector $S_1$ is connected to a scan input terminal 12, and a first input of each of the other selectors $S_2$ to $S_n$ is connected to the Q output of the just before flipflop. Second inputs of all the selectors $S_1$ to $S_n$ are connected to an associated combination circuit 14 which is a circuit to be tested. Further, the clock inputs of all the flipflops $F_1$ to $F_n$ are connected to a clock signal terminal 16, and the last stage flipflop $F_n$ is connected at its Q output to a scan output terminal 18.

In the arrangement as mentioned above, four external terminals 10, 12, 16 and 18 are required for the scan path testing. Of the four terminals, the scan input terminal 12 and the scan output terminal 18 can be dedicated for not only the scan path testing but also for any other purpose.

Figure 2:
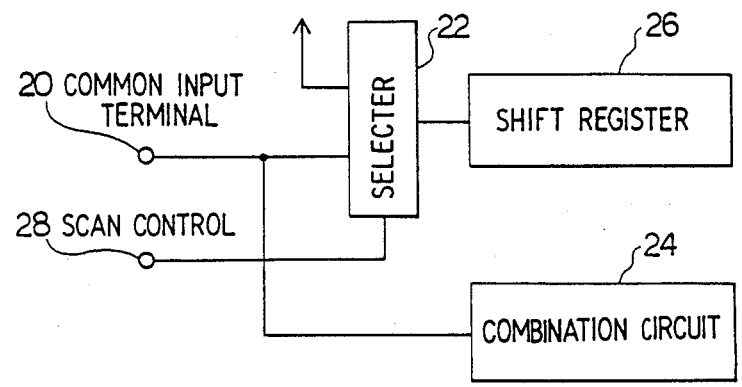
FIG. 2 is a block diagram illustrating an input terminal common to a scan operation and a normal operation.

Turning to FIG. 2, there is illustrated an example in which a scan input terminal is common to a normal input terminal. A common input terminal 20 is connected to one input of a selector 22 and an input of a combination circuit 24. An output of the selector 22 is connected to an input of a shift register 26. A scan control terminal 28 is connected to a control input of the selector 22. With this arrangement, whether or not a signal inputted to the common input terminal 20 is transferred to the shift register 26 is determined on the basis of whether the level of a signal on the scan control terminal 28 is at a high level "H" or at a low level "L".

Figure 3:
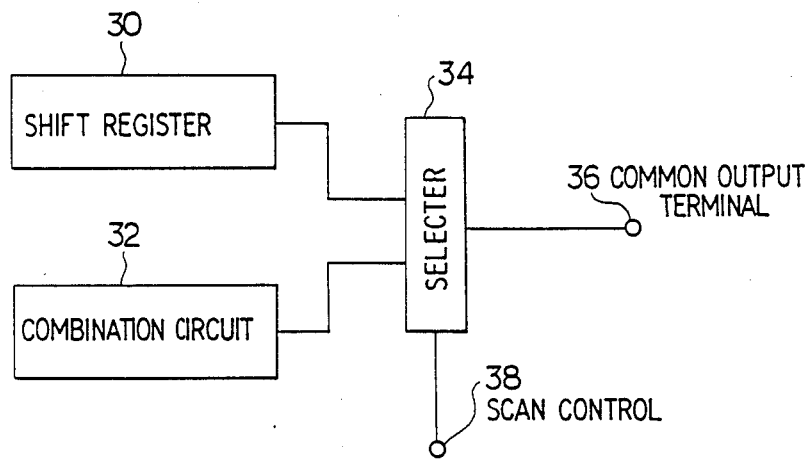
FIG. 3 is a block diagram illustrating an output terminal common to a scan operation and a normal operation.

Referring to FIG. 3, there is illustrated an example in which a scan output terminal is common to a normal output terminal. A shift register 30 and a combination circuit 32 are connected at their outputs to a selector 34, whose output is connected to a common output terminal 36 and whose control input is connected to a scan control terminal 38. With this arrangement, an output of either the shift register 30 or the combination circuit 32 is outputted through the selector 34 to the common output terminal 36 on the basis of whether the level of a signal on the scan control terminal 38 is at a high level "H" or at a low level "L".

As seen from the above explanation, in the prior art, at least two terminals are required as those dedicated for the scan path testing. This problem would be caused for the fact that a signal for selection between a normal mode and a shift register mode for the scan path testing must be given from an external.

Figure 4:
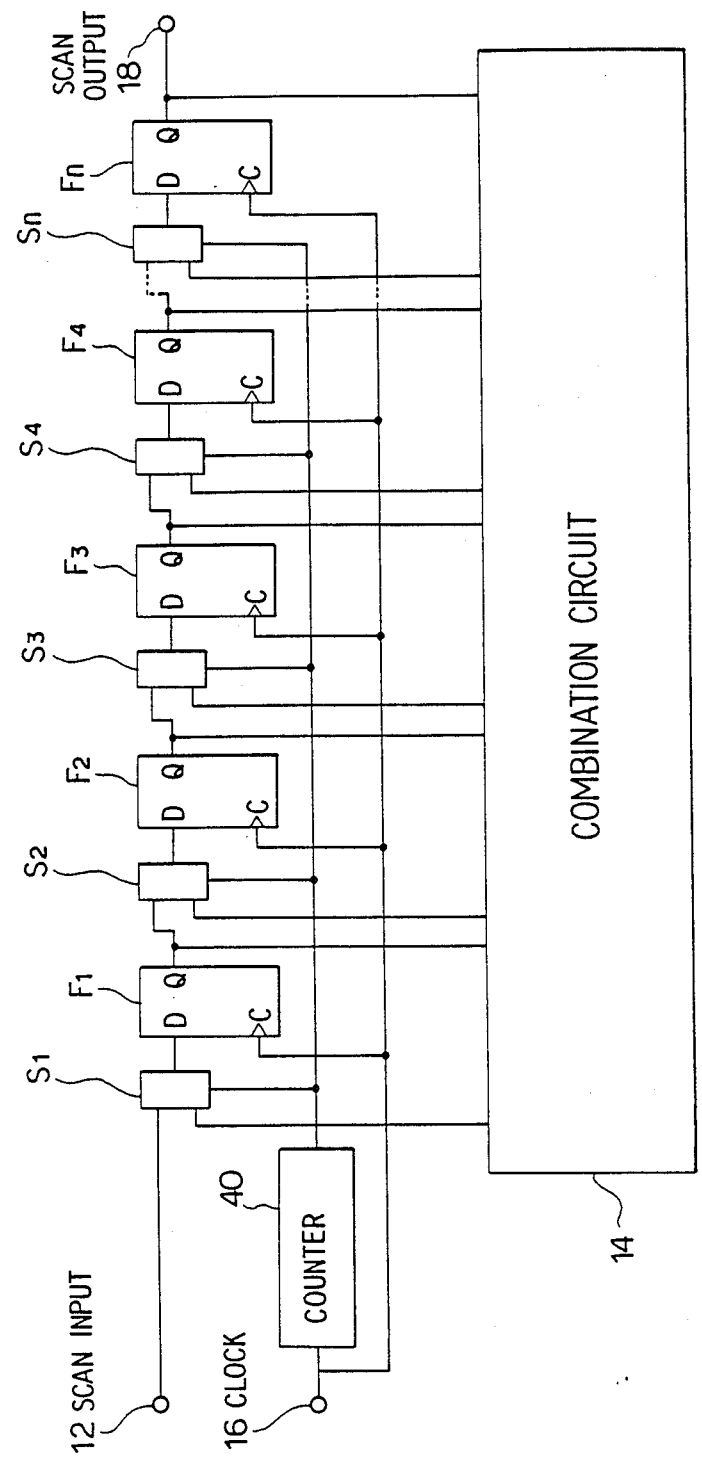
FIG. 4 is a block diagram of a first embodiment of a logic integrated circuit for the scan path system in accordance with the present invention.

Turning to FIG. 4, there is shown a first embodiment of the logic integrated circuit for the scan path system in accordance with the present invention. In FIG. 4, elements similar to those shown in FIG. 1 are given the same Reference Numerals, and explanation thereof will be omitted.

Figure 5:
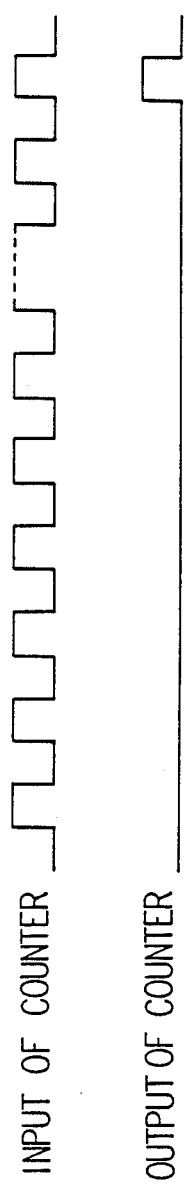
FIG. 5 is a waveform diagram for illustrating an operation of a divide-by-n counter.

As seen from comparison between FIGS. 1 and 4, the embodiment shown in FIG. 4 does not include a terminal corresponding to the scan control terminal 10 of the circuit shown in FIG. 1, but includes a divide-by-n counter 40 whose input is connected to the clock terminal 16 and whose output is connected to the control inputs of all the selectors $S_1$ to $S_n$. This counter 40 has a frequency division ratio equivalent to the stage number "n" of the shift register constituted by the cascade of flipflops $F_1$ to $F_n$ which are D-type flipflops in this embodiment. The counter 40 counts a train of pulses as shown in FIG. 5 inputted to the clock terminal 16 and generates a frequencydivided pulse for each n pulses, as shown in FIG. 5. This frequency-divided pulse is supplied to all the selectors $S_1$ to $S_n$ as a control signal for selection between the shift register mode and the normal mode.

When the output of the counter 40 is at a low level "L", the selectors $S_1$ to $S_n$ block the signals from the combination circuit 14, so that the flipflops $F_1$ to $F_n$ function one shift register as a whole. On the other hand, if the output of the counter 40 is at a high level "H", each of the selectors $S_1$ to $S_n$ blocks the Q output of the just preceding flipflop, so that all the flipflops $F_1$ to $F_n$ are set by information signals at various circuit points in the combination circuit.

With the above arrangement, while a first clock pulse to n-th clock pulse are inputted to the clock terminal 16, the counter 40 maintains its output at a low level "L", and therefore, the flipflops $F_1$ to $F_n$ operate in the shift register mode. When (n+1)th clock pulse is inputted to the clock terminal 16, the flipflops $F_1$ to $F_n$ will be set by combination circuit 14 since the output of the counter 40 is at a high level "H". Thus, it is not necessary to provide a scan control terminal as an external terminal dedicated for only the scan path.

Accordingly, various circuits in the combination circuit 14 are initialized for testing by serially writing setting signals to the cascaded flipflops $F_1$ to $F_n$ in the shift register mode from the scan input terminal 12 in synchronism with the 1st to nth clock pulses, and then transferring the content of each flipflop to the combination circuit in the normal mode when (n+1)th clock pulse is inputted. Thereafter, the test results of the various circuits in the combination circuit 14 are set to the corresponding flipflops when the shift register is in the normal mode, and then, the contents of the flipflops are serially read out from the scan output terminal 18 in the register mode in synchronism with the 1st to nth clock pulses, so that the read out contents will be explained.

The moment the output of the divide-by-n counter 40 is brought into a high level "H" can be easily known by such a manner that a suitable value is inputted to the scan input terminal 12 and a train of clock pulses are supplied to the clock terminal 16, so that the condition of the output terminal 18 is compared with a condition of an output terminal which is other than the scan path dedicated terminals and which is previously known from a logic simulation or the like.

Figure 6:
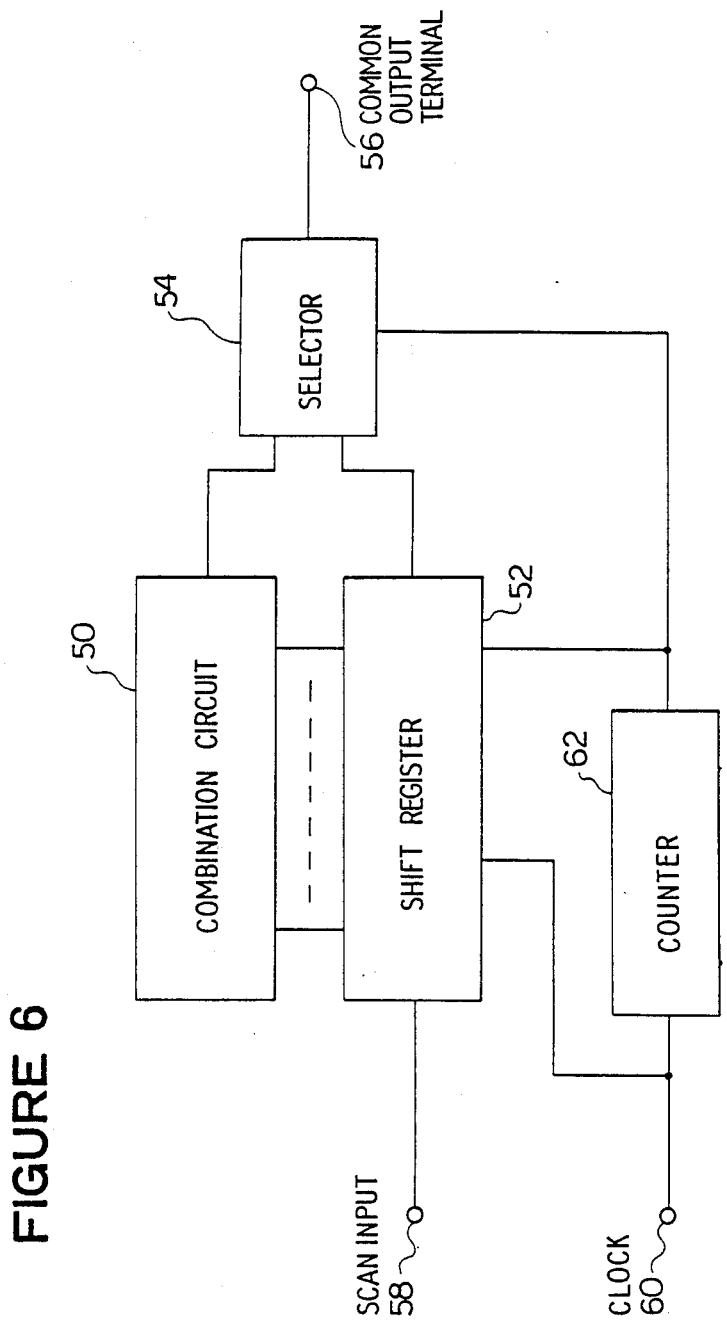
FIG. 6 is a block diagram of a second embodiment of the logic integrated circuit for the scan path system.

Turning to FIG. 6, there is shown a second embodiment of the logic integrated circuit for the scan path system. The second embodiment comprises a combination circuit 50 which is a circuit to be tested, and a shift register 52 of a scan path structure associated to the combination circuit 50 and composed of a cascade of flipflops. The combination circuit 50 and the shift register 52 are connected at their outputs to a selector 54, which is in turn connected at its output to an output terminal 56 common to the scan operation and the normal operation. On the other hand, a scan input terminal 58 is connected to an input of the shift register 52, and a clock terminal 60 is connected to a clock input of the shift register 52 and an input of a divide-by-m counter 62. This counter 62 has a frequency division ratio corresponding to the number "m" of the flipflops included in the shift register 52. The counter 62 is connected at its output to a control input of the selector 54 and a scan control terminal of the shift register 52 (corresponding to the control inputs of the selectors $S_1$ to $S_n$ in FIG. 4). In response to the output of the counter 62, the selector 54 supplies either the output of the combination circuit 50 or the output of the shift register 52 to the common output terminal 56. Namely, the selector 54 selectively uses the common output terminal 56 either as a scan output terminal or as a normal output terminal.

With this arrangement, the use of the counter 62 enables not only the mode selection of the scan path structure shift register but also to modify the scan output terminal (dedicated for only the scan path testing) to an output terminal common to the scan path output and the normal output. Accordingly, the terminals dedicated for only the scan path system can be decreased.

As seen from the above explanation, the circuit in accordance with the present invention includes a counter receiving a clock signal to generate a scan control signal obtained by frequency-dividing the received clock signal, so that the control signal used for selection between the shift register mode for the scan path testing and the normal mode can be generated in the interior of the logic integrated circuit. Thus, the scan control terminal required in the prior art as a terminal dedicated for only the scan path testing has become unnecessary. Accordingly, the external terminals dedicated for only the scan path testing can be decreased in the logic integrated circuit for the scan path system.

The invention has thus been shown and described with reference to the specific embodiments. However, it should be noted that the invention is in no way limited to the details of the illustrated structures but changes and modifications may be made within the scope of the appended claims.

I claim:

1. A logic integrated circuit for performing scan path testing of a combination circuit having a plurality of outputs, comprising:

a plurality of flipflops coupled in a cascaded arrangement, each of said flipflops having a data input, a data output and a clock input;

a clock terminal commonly connected to the clock inputs of all the plurality of flipflops;

a scan input terminal connected to the data input of a first flipflop of said flipflops;

a scan output terminal connected to the data output of a last flipflop of said flipflops;

a plurality of selectors each located just before each of the flipflops, each of the selectors except a first selector having a first input connected to the data output of an immediately preceding flipflop, each of said selectors having a second input connected to a corresponding one of the outputs of the combination circuit, an output connected to the data input of an immediately succeeding flipflop and a selection control input; and a counter having an input connected to the clock terminal and an output connected to the selection control input of each selector, the counter generating a frequency division signal having a frequency division ratio equivalent to the number of the flipflops, so that when the counter does not generate a frequency division signal, selectors supply the data output of an immediately preceding flipflop to the data input of the immediately succeeding flipflop whereby a shift register is formed by all the flipflops, and when the counter generates the frequency division signal, selectors supply the corresponding output of the combination circuit to the data input of the immediately succeeding flipflop whereby the flipflops do not form the shift register and function to latch the corresponding outputs of the combination circuit.

2. A circuit claimed in claim 1 further including an output selector having plural inputs connected to an output of the combination circuit and the output of the shift register, the output selector having an output connected to the scan output terminal and an control input connected to the output of the counter so that either one of the outputs of the combination circuit and the shift register is selectively outputted through the scan output terminal in accordance with the output of the counter.

* * * * *